United States Patent
Kim

(10) Patent No.: US 8,665,509 B2
(45) Date of Patent: Mar. 4, 2014

(54) METHOD OF BONDING METAL AND GLASS USING OPTICAL CONTACT BONDING, METHOD OF MANUFACTURING DISPLAY APPARATUS USING THE METHOD OF BONDING, AND DISPLAY APPARATUS MANUFACTURED BY THE METHOD OF BONDING

(75) Inventor: Joon-Hyung Kim, Yongin (KR)

(73) Assignee: Samsung Display Co., Ltd. (KR)

( * ) Notice: Subject to any disclaimer, the term of this patent is extended or adjusted under 35 U.S.C. 154(b) by 411 days.

(21) Appl. No.: 13/081,442

(22) Filed: Apr. 6, 2011

(65) Prior Publication Data

US 2012/0161177 A1    Jun. 28, 2012

(30) Foreign Application Priority Data

Dec. 23, 2010 (KR) ........................ 10-2010-0133708

(51) Int. Cl.
*G02F 1/15* (2006.01)
(52) U.S. Cl.
USPC ............................ 359/265; 359/267; 359/272
(58) Field of Classification Search
USPC ......................................... 359/267, 265, 272
See application file for complete search history.

(56) References Cited

U.S. PATENT DOCUMENTS

| 6,195,193 B1* | 2/2001 | Anderson et al. ............. 359/265 |
| 2006/0215123 A1 | 9/2006 | Aoki |
| 2010/0059776 A1 | 3/2010 | Barnes et al. |

FOREIGN PATENT DOCUMENTS

| JP | 2005-149666 | 6/2005 |
| JP | 2005-202414 A | 7/2005 |
| KR | 10-2006-0102289 A | 9/2006 |
| KR | 10-2009-0089431 A | 8/2009 |
| KR | 1020090114167 A | 11/2009 |

OTHER PUBLICATIONS

Optical Contact Bonding, Article, Apr. 8, 2011, 2 pages, Wikipedia, the free encyclopedia, http://en.wikipedia.org/wiki/Optical_contact_bonding.

* cited by examiner

*Primary Examiner* — Howard Weiss
*Assistant Examiner* — Steven Rao
(74) *Attorney, Agent, or Firm* — Knobbe Martens Olson & Bear, LLP

(57) ABSTRACT

A method of bonding metal and glass using an optical contact bonding includes depositing an optical contact bonding medium on a surface of a metal substrate; and bonding the metal substrate on which the optical contact bonding medium is formed to a glass substrate using optical contact bonding.

20 Claims, 3 Drawing Sheets

METHOD OF BONDING METAL AND GLASS USING OPTICAL CONTACT BONDING, METHOD OF MANUFACTURING DISPLAY APPARATUS USING THE METHOD OF BONDING, AND DISPLAY APPARATUS MANUFACTURED BY THE METHOD OF BONDING

CROSS-REFERENCE TO RELATED APPLICATION

This application claims the benefit of Korean Patent Application No. 10-2010-0133708, filed on Dec. 23, 2010, in the Korean Intellectual Property Office, the disclosure of which is incorporated herein in its entirety by reference.

BACKGROUND

1. Field

The present embodiments relate to a method of bonding metal and glass using optical contact bonding, a method of manufacturing a display apparatus using the method of bonding, and a display apparatus manufacture using the method of manufacturing a display apparatus.

2. Description of the Related Technology

Non-sticking materials such as metal and glass are bonded by heating or melting an adhesive after coating the adhesive such as epoxy or frit on a surface of the metal or glass.

When metal and glass are bonded using an adhesive, the bonding force of the adhesive is reduced in an extreme atmosphere or in vacuum, the bonding part can be separated due to the thermal expansion coefficient difference between the metal and glass, or yield can be reduced by high rate of product failure due to out gassing of the adhesive.

SUMMARY OF CERTAIN INVENTIVE ASPECTS

To address the above and/or other problems, the present embodiments provide a method of bonding metal and glass using an optical contact bonding without using a conventional adhesive, a method of manufacturing a display apparatus using the method of bonding, and a display apparatus manufactured using the method of manufacturing a display apparatus.

According to an aspect of the present embodiments, there is provided a method of bonding metal and glass, the method including: depositing an optical contact bonding medium on a surface of a metal substrate; and bonding the metal substrate on which the optical contact bonding medium is formed to a glass substrate using optical contact bonding.

The optical contact bonding medium may be formed by depositing silicon oxide on a surface of the metal substrate.

The bonding of the metal substrate to the glass substrate may further include heating the optical contact bonding medium.

The heating of the optical contact bonding medium may include heating the optical contact bonding medium to a predetermined level at an increasing rate, maintaining the increased temperature for a predetermined period of time, and decreasing the temperature at a decreasing rate faster than the increasing rate.

The method may further include applying a weight to the metal substrate and the glass substrate while the optical contact bonding medium is heated.

The method may further include washing a region to be bonded by the optical contact bonding medium of the metal substrate and the glass substrate before the metal substrate and the glass substrate are bonded.

The method may further include polishing the region to be bonded by the optical contact bonding medium of the metal substrate and the glass substrate before the metal substrate and the glass substrate are bonded.

According to an aspect of the present embodiments, there is provided a method of manufacturing a display apparatus, the method including: forming a display device on a surface of a glass substrate; depositing an optical contact bonding medium on a surface of a metal substrate; and bonding the metal substrate on which the optical contact bonding medium is formed to the glass substrate on which the display device is deposited.

The method may further include coating a reflection layer on a surface of the metal substrate facing the display device;

According to an aspect of the present embodiments, there is provided a display apparatus including: a glass substrate on which a display device is formed; and a metal substrate that has an optical contact bonding medium on a region thereof surrounding the display device and is bonded to the glass substrate by the optical contact bonding medium.

The optical contact bonding medium may include silicon oxide.

Regions of the metal substrate and the glass substrate to be bonded to each other by the optical contact bonding medium may have a flatness in a range from 0.1 to 0.25$\lambda$ of a reference wavelength.

The total flatness of the metal substrate and the glass substrate may be 0$\lambda$.

The metal substrate and the glass substrate may have a surface roughness, that is, a root-mean-square roughness (RMS value), in a range from 1 Å to 10 Å, and the maximum peak-to-valley roughness in a range from 100 Å to 500 Å.

The metal substrate and the glass substrate may have a scratch and dig in a range from 40 to 60.

The display device may be an organic light-emitting device.

The organic light-emitting device sequentially may include a first electrode, a light-emitting layer, and a second electrode in the order stated, and light generated from the light-emitting layer may be emitted towards the glass substrate.

The first electrode may be a transparent electrode, and the second electrode may be a reflection electrode.

The display apparatus may further include a reflection layer on a surface of the metal substrate facing the display device.

The reflection layer may comprise aluminium or silver.

BRIEF DESCRIPTION OF THE DRAWINGS

The above and other features and advantages of the present embodiments will become more apparent by describing in detail exemplary embodiments thereof with reference to the attached drawings in which.

DETAILED DESCRIPTION

The present embodiments will now be described more fully with reference to the accompanying drawings in which exemplary embodiments are shown.

Figure 1:
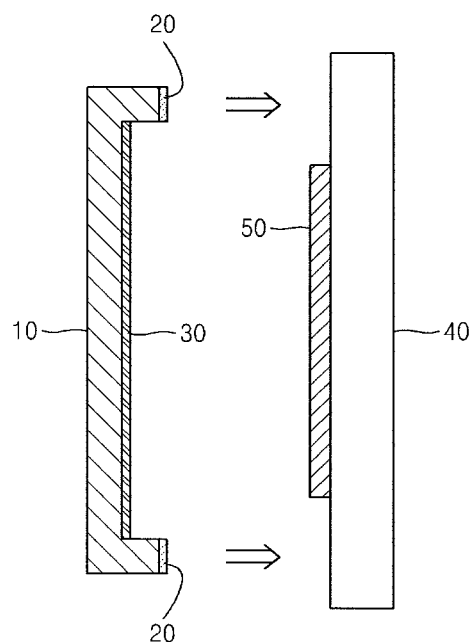
FIG. 1 is a schematic cross-sectional view showing a method of manufacturing a display apparatus according to an embodiment.

FIG. 1 is a schematic cross-sectional view showing a method of manufacturing a display apparatus according to an embodiment.

Referring to FIG. 1, a metal substrate 10 on which an optical contact bonding medium 20 is formed is bonded to a glass substrate 40 on which a display device 50 is attached.

The optical contact bonding medium 20 is deposited on a surface of the metal substrate 10. Although not shown in detail, the deposition process may be performed in a vacuum chamber (not shown).

The optical contact bonding medium 20 may be silicon oxide. Through the optical contact bonding medium 20, the metal substrate 10 and the glass substrate 40 are bonded by an optical contact bonding force which is a kind of a molecular bonding force such as a Van der Waal's force.

The thickness of the optical contact bonding medium 20 in FIG. 1 is exaggerated for convenience of explanation. Unlike a conventional adhesive, the optical contact bonding medium 20 has a small thickness.

The metal substrate 10 may comprise various materials, for example, a metal selected from the group consisting of iron, nickel, aluminium, and titanium or an alloy of these metals. In the current embodiment, the metal substrate 10 is invar of a Fe/Ni alloy.

After depositing the optical contact bonding medium 20 on the metal substrate 10, the method may further include heating the optical contact bonding medium 20 to reinforce the optical contact bonding when the metal substrate 10 and the glass substrate 40 are bonded.

Figure 2:
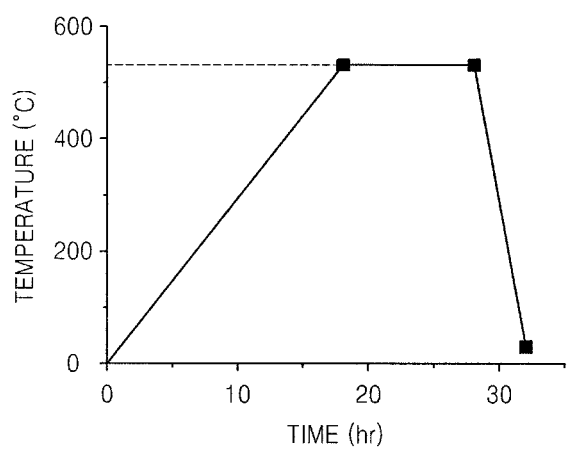
FIG. 2 is a graph showing a time variation of temperature applied to an optical contact bonding medium in a method of manufacturing a display apparatus according to an embodiment.

FIG. 2 is a graph showing a time variation of temperature applied to the optical contact bonding medium 20 in the method of manufacturing a display apparatus according to an embodiment.

Referring to FIG. 2, a heating process with a temperature profile in which the optical contact bonding medium 20 is heated to a predetermined temperature at an increasing rate, is maintained at the increased temperature for a predetermined period of time, and is cooled at a decreasing rate faster than the increasing rate.

The metal substrate 10 was formed of an invar, and the optical contact bonding medium 20 was formed of silicon oxide. When the silicon oxide is used as the optical contact bonding medium 20, the porous silicon oxide is dried and the density thereof is increased by the heating process. Also, due to the expansion of the silicon oxide, the area of bonding surface is increased, and thus, the bonding force between the metal substrate 10 and the glass substrate 40 by the optical contact bonding can be further increased.

Although not shown, a predetermined weight may be applied to the metal substrate 10 and the glass substrate 40 while the optical contact bonding medium 20 is heated to maintain a small gap between the metal substrate 10 and the glass substrate 40 and to prevent separation of the metal substrate 10 and the glass substrate 40 from each other during heating. In the current embodiment, a weight of 1.2~2.0 kg/cm$^2$ was applied to the optical contact bonding medium 20. The weight may vary according to the kind of the optical contact bonding medium 20 and the state of substrates to be bonded.

In an optical contact bonding, the main parameters that determine the bonding force between the metal substrate 10 and the glass substrate 40 are related to a surface state, such as flatness and surface roughness of the metal substrate 10 where the optical contact bonding medium 20 is deposited and the glass substrate 40.

From among the parameters related to the surface state, the flatness of the metal substrate 10 where the optical contact bonding medium 20 is deposited and the glass substrate 40 may be maintained in a range from 0.1λ to 0.25λ at a 632.8 nm which is a reference wavelength. Also, the total flatness of the metal substrate 10 where the optical contact bonding medium 20 is deposited and the glass substrate 40 may be maintained at 0λ.

As another parameter related to the surface state, the surface roughness of the metal substrate 10 and the glass substrate 40, that is, the root-mean-square roughness (RMS value) may be in a range from 1 Å to 10 Å, and the maximum peak-to-valley roughness may be in a range from 100 Å to 500 Å.

Of course, besides the flatness and the surface roughness, the scratch and dig, which is a parameter related to scratch and dig of a surface, may be in a range from 40 to 60.

In order to maintain the surface states of the metal substrate 10 and the glass substrate 40 where the optical contact bonding medium 20 is deposited, a process of washing the metal substrate 10 and the glass substrate 40 may be performed before depositing the optical contact bonding medium 20 or bonding the metal substrate 10 and the glass substrate 40. The washing process may further include a washing process for removing an inorganic or organic material from a bonding surface. The polishing process may be performed by using mechanical polishing or a chemical polishing.

Figure 3:
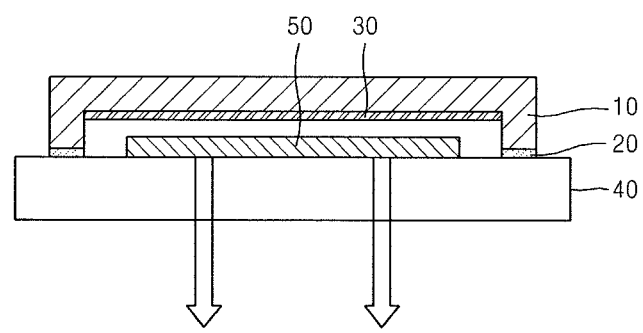
FIG. 3 is a schematic cross-sectional view of a display apparatus manufactured according to the method of manufacturing a display apparatus according to an embodiment.
Figure 4:
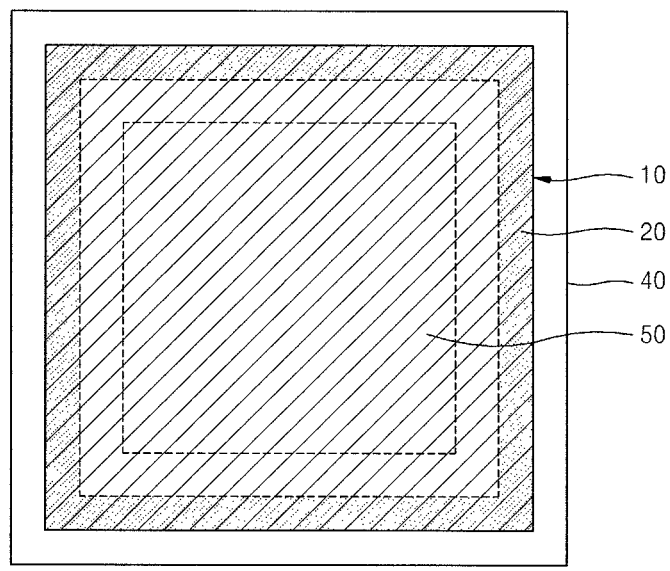
FIG. 4 is a schematic plan view of a display apparatus manufactured according to the method of manufacturing a display apparatus according to an embodiment.

FIG. 3 is a schematic cross-sectional view of a display apparatus manufactured according to the method of manufacturing a display apparatus according to an embodiment. FIG. 4 is a schematic plan view of the display apparatus of FIG. 3, and FIG. 5 is a magnified schematic cross-sectional view of a portion of the display apparatus of FIG. 3.

Figure 5:
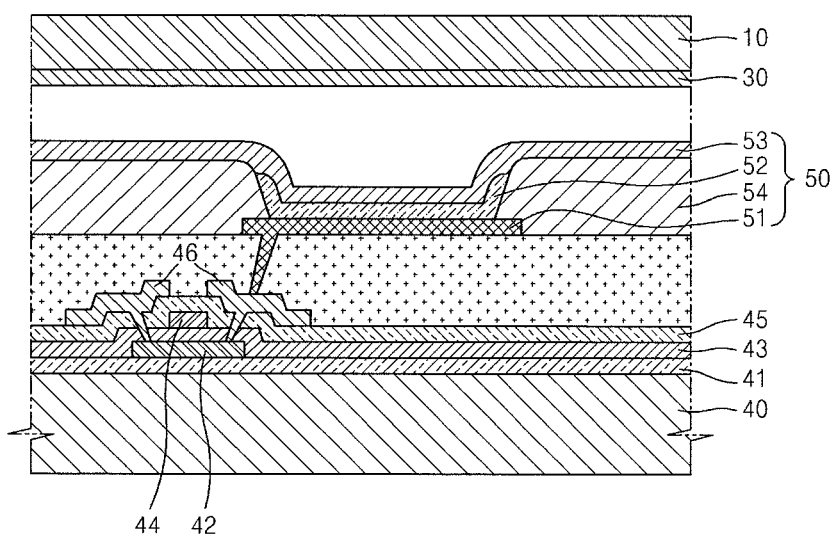
FIG. 5 is a magnified schematic cross-sectional view of a portion of a display apparatus manufactured according to the method of manufacturing a display apparatus according to an embodiment.

Referring to FIGS. 3, 4, and 5, in the display apparatus, the metal substrate 10 where the optical contact bonding medium 20 is deposited is bonded to the glass substrate 40 having attached thereon a display device 50.

The display device 50 may be configured in various ways on the glass substrate 40. In the current embodiment, the display device 50 is an organic light-emitting device, and the organic light-emitting device may sequentially include a first electrode 51, a light-emitting layer 52, and a second electrode 53 from the glass substrate 40. Thus, the display device 50 may be configured as a top emission type in which light generated from the light-emitting layer 52 is emitted through the glass substrate 40 since light cannot be emitted through the metal substrate 10.

In FIGS. 3 through 5, an active matrix type organic light-emitting device is depicted. However, the present embodiments are not limited thereto, that is, the organic light-emitting device may be a passive matrix type.

Referring to FIG. 5, as an example of an active matrix type organic light-emitting device, a buffer layer 41 is formed on the glass substrate 40, and a semiconductor layer 42 is formed on the buffer layer 41. A gate insulating film 43 is formed on the semiconductor layer 42, and a gate electrode 44 is formed on the gate insulating film 43. An interlayer insulating layer 45 is formed on the gate electrode 44, source and drain electrodes 46 are connected to source and drain regions (not shown) of the semiconductor layer 42 through a via hole (not shown) that passes through the interlayer insulating layer 45. The first electrode 51 is connected to one of the source and drain electrodes 46, and the light-emitting layer 52 and the second electrode 53 are formed on the first electrode 51. A pixel defining film 54 that defines pixels is formed on an edge of the first electrode 51.

Since the display device 50 as an organic light-emitting device is a top emission type, the first electrode 51 may be a transparent material, and the second electrode 53 may be a reflection electrode.

When a voltage is applied between the first electrode 51 and the second electrode 53 respectively used as an anode electrode and a cathode electrode, excitons are formed in the light-emitting layer 52 as a result of combining electrons and holes injected from the first electrode 51 and the second electrode 53, and the light-emitting layer 52 generates light due to the excitons, thereby displaying an image.

The organic light-emitting film 52 may comprise a low molecule organic material or a polymer organic material. If the organic light-emitting film 52 comprises a low molecule organic material, a hole injection Layer (HIL) (not shown), a hole transport layer (HTL) (not shown), an electron transport layer (ETL) (not shown), and an electron injection layer (EIL) (not shown) may be stacked in a single structure or a composite structure interposing the light-emitting layer 52 therebetween. The low molecule organic material may be various organic materials such as copper phthalocyanine (CuPc), N,N'-di(naphthalene-1-yl)-N,N'-diphenyl-benzidine (NPB), or tris-8-hydroxyquinoline aluminum (Alq3).

If the light-emitting layer 52 comprises a polymer organic material, the display device 50 may have a structure in which a hole transport layer (HTL) is further included from the light-emitting layer 52 towards the anode electrode. At this point the HTL may comprise poly-(2,4)-ethylene-dihydroxy thiophene (PEDOT), and the light-emitting layer 52 may comprise a polymer organic material such as a poly-phenylenevinylene (PPV) group material or a polyfluorene group material.

As in the current embodiment, a reflection layer 30 may further be formed on a surface of the metal substrate 10 facing the display device 50. The reflection layer 30 may comprise aluminium or silver. The reflection layer 30 reflects light that passes the second electrode 53, which is a reflection electrode, towards the metal substrate 10 without being reflected by the second electrode 53 towards the glass substrate 40, and thus, further increases the optical efficiency of the display device 50.

According to the method of bonding metal-glass using an optical contact bonding according to an embodiment, the method of manufacturing a display apparatus using the method, and the display apparatus manufactured according the method of manufacturing a display apparatus, a metal and glass are bonded by optical contact bonding of molecules on a bonding surface without using an adhesive, thereby preventing problems caused by the conventional adhesive.

In the drawings, elements are exaggerated or contracted for convenience of explanation. Therefore, the present embodiments are not limited to the sizes and shapes of the elements in the drawings. It will be understood by those of ordinary skill in the art that various changes in form and details may be made therein without departing from the spirit and scope of the present embodiments as defined by the following claims.

What is claimed is:

1. A method of bonding metal and glass, the method comprising:
    depositing an inorganic optical contact bonding medium on the surface of a metal substrate; and
    bonding the metal substrate on which the inorganic optical contact bonding medium is formed to a glass substrate using optical contact bonding.

2. The method of claim 1, wherein the optical contact bonding medium is formed by depositing silicon oxide on the surface of the metal substrate.

3. The method of claim 1, wherein the bonding of the metal substrate to the glass substrate further comprises heating the optical contact bonding medium.

4. The method of claim 3, wherein the heating of the optical contact bonding medium comprises heating the optical contact bonding medium to a predetermined level at an increasing rate, maintaining the increased temperature for a predetermined period of time, and decreasing the temperature at a decreasing rate which is faster than the increasing rate.

5. The method of claim 3, further comprising applying a weight to the metal substrate and the glass substrate while the optical contact bonding medium is heated.

6. The method of claim 1, further comprising washing a region to be bonded by the optical contact bonding medium of the metal substrate and the glass substrate before the metal substrate and the glass substrate are bonded.

7. The method of claim 1, further comprising polishing the region to be bonded by the optical contact bonding medium of the metal substrate and the glass substrate before the metal substrate and the glass substrate are bonded.

8. A method of manufacturing a display apparatus, the method comprising:
    forming a display device on a surface of a glass substrate;
    depositing an inorganic optical contact bonding medium on a surface of a metal substrate; and
    bonding the metal substrate on which the inorganic optical contact bonding medium is formed to the glass substrate on which the display device is deposited.

9. The method of claim 8, further comprising coating a reflection layer on a surface of the metal substrate facing the display device.

10. A display apparatus comprising:
    a glass substrate on which a display device is formed; and
    a metal substrate that has an inorganic optical contact bonding medium on a region thereof surrounding the display device and is bonded to the glass substrate by the inorganic optical contact bonding medium.

11. The display apparatus of claim 10, wherein the optical contact bonding medium comprises silicon oxide.

12. The display apparatus of claim 10, wherein regions of the metal substrate and the glass substrate to be bonded to each other by the optical contact bonding medium have a flatness in a range from 0.1 to 0.25λ of a reference wavelength.

13. The display apparatus of claim 10, wherein the total flatness of the metal substrate and the glass substrate is 0λ.

14. The display apparatus of claim 10, wherein the metal substrate and the glass substrate have a root-mean-square roughness (RMS value), in a range from 1 Å to 10 Å, and a maximum peak-to-valley roughness in a range from 100 Å to 500 Å.

15. The display apparatus of claim 10, wherein the metal substrate and the glass substrate have a scratch-dig ratio in a range from 40 to 60.

16. The display apparatus of claim 10, wherein the display device is an organic light-emitting device.

17. The display apparatus of claim 10, wherein the organic light-emitting device sequentially comprises a first electrode, a light-emitting layer, and a second electrode in the order stated, and light generated from the light-emitting layer is emitted towards the glass substrate.

18. The display apparatus of claim 17, wherein the first electrode is a transparent electrode, and the second electrode is a reflection electrode.

19. The display apparatus of claim 16, further comprising a reflection layer on a surface of the metal substrate facing the display device.

20. The display apparatus of claim 19, wherein the reflection layer comprises aluminium or silver.

* * * * *